US012760440B2

(12) United States Patent
Kim

(10) Patent No.: US 12,760,440 B2
(45) Date of Patent: Oct. 13, 2026

(54) METHOD AND APPARATUS FOR GROWING SILICON SINGLE CRYSTAL INGOTS

(71) Applicant: SK SILTRON CO., LTD., Gyeongsangbuk-do (KR)

(72) Inventor: Woo Tae Kim, Gyeongsangbuk-do (KR)

(73) Assignee: SK SILTRON CO., LTD., Gumi-si (KR)

( * ) Notice: Subject to any disclaimer, the term of this patent is extended or adjusted under 35 U.S.C. 154(b) by 457 days.

(21) Appl. No.: 18/037,116

(22) PCT Filed: Dec. 22, 2020

(86) PCT No.: PCT/KR2020/018902

§ 371 (c)(1),
(2) Date: May 16, 2023

(87) PCT Pub. No.: WO2022/114367

PCT Pub. Date: Jun. 2, 2022

(65) Prior Publication Data

US 2024/0003047 A1 Jan. 4, 2024

(30) Foreign Application Priority Data

Nov. 25, 2020 (KR) ........................ 10-2020-0159536

(51) Int. Cl.
*C30B 15/20* (2006.01)
*C30B 15/02* (2006.01)
(Continued)

(52) U.S. Cl.
CPC .............. *C30B 15/20* (2013.01); *C30B 15/02* (2013.01); *C30B 15/14* (2013.01); *C30B 15/30* (2013.01); *C30B 29/06* (2013.01)

(58) Field of Classification Search
CPC ......... C30B 15/02; C30B 15/14; C30B 15/20; C30B 15/30; C30B 25/14; C30B 25/16; C30B 29/06
See application file for complete search history.

(56) References Cited

U.S. PATENT DOCUMENTS 5,846,318 A * 12/1998 Javidi ..................... C30B 15/20 117/14
2004/0226504 A1* 11/2004 Nakashima ............. C30B 29/06 117/208
(Continued)

FOREIGN PATENT DOCUMENTS

CN 102011178 4/2011
JP 6-129911 5/1994
(Continued)

OTHER PUBLICATIONS

International Search Report dated Aug. 13, 2021 issued in Application No. PCT/KR2020/018902.
(Continued)

*Primary Examiner* — Hua Qi
(74) *Attorney, Agent, or Firm* — KED & ASSOCIATES, LLP

(57) ABSTRACT

An embodiment provides a method for growing silicon single crystal ingots, comprising the steps of: (a) injecting polysilicon into a crucible inside a chamber; (b) melting the polysilicon in the crucible to form a silicon melt; (c) measuring the degree of melting of the polysilicon; and (d) increasing, after a predetermined part of the polysilicon has been melted, the supply amount of an inert gas supplied to the chamber, and decreasing the pressure inside the chamber.

8 Claims, 8 Drawing Sheets

(51) Int. Cl.

| | |
|---|---|
| ***C30B 15/14*** | (2006.01) |
| ***C30B 15/30*** | (2006.01) |
| ***C30B 29/06*** | (2006.01) |

(56) References Cited

U.S. PATENT DOCUMENTS

| | | | | |
|---|---|---|---|---|
| 2005/0263063 A1 | 12/2005 | Harada et al. | | |
| 2007/0119365 A1* | 5/2007 | Harada | C30B 35/00 | 117/32 |
| 2010/0107966 A1* | 5/2010 | Javidi | C30B 15/00 | 117/35 |
| 2010/0162944 A1* | 7/2010 | Azuma | C30B 15/20 | 117/35 |

FOREIGN PATENT DOCUMENTS

| | | | |
|---|---|---|---|
| JP | 2000-159596 | 6/2000 | |
| JP | 2002362996 A * | 12/2002 | |
| KR | 10-2002-0019000 | 3/2002 | |
| KR | 10-0771479 | 10/2007 | |
| KR | 10-2009-0034465 | 4/2009 | |
| KR | 10-2012-0045307 | 5/2012 | |
| KR | 10-2012-0116614 | 10/2012 | |
| KR | 10-2014-0018671 | 2/2014 | |
| KR | 10-2015-0073486 | 7/2015 | |
| KR | 10-2017-0075280 | 7/2017 | |
| KR | 10-2018-0016480 | 2/2018 | |
| KR | 10-2020-0086019 | 7/2020 | |
| KR | 10-2157388 | 9/2020 | |
| WO | WO-2019097875 A1 * | 5/2019 | C30B 15/20 |

OTHER PUBLICATIONS

Korean Notice of Allowance dated Jan. 17, 2023 issued in Application No. 10-2020-0159536.

Chinese Office Action issued in Application No. 202080107486.2 dated Feb. 7, 2025.

* cited by examiner

METHOD AND APPARATUS FOR GROWING SILICON SINGLE CRYSTAL INGOTS

CROSS-REFERENCE TO RELATED PATENT APPLICATIONS

This application is a U.S. National Stage Application under 35 U.S.C. § 371 of PCT Application No. PCT/KR2020/018902, filed Dec. 22, 2020, which claims priority to Korean Patent Application No. 10-2020-0159536, filed Nov. 25, 2020, whose entire disclosures are hereby incorporated by reference.

TECHNICAL FIELD

Embodiments relate to growth of a silicon single crystal ingot, and more particularly to a method and an apparatus for growing a silicon single crystal ingot, which are capable of preventing generation of pin holes in a wafer manufactured after growth of a silicon single crystal ingot due to dissolution of argon (Ar) atoms in a silicon melt during growth of the silicon single crystal ingot.

BACKGROUND ART

Typically, a silicon wafer is manufactured through inclusion of a single crystal growth process for production of an ingot, a slicing process for slicing the ingot, thereby obtaining a wafer having a thin disc shape, a lapping process for removing damage, caused by mechanical machining, remaining in the wafer due to the slicing, a polishing process for mirror-polishing the wafer, and a cleaning process for mirror-polishing the polished wafer and removing an abrasive and foreign matter attached to the wafer.

Among the above-mentioned processes, the process for growing a silicon single crystal may be performed by heating a growth crucible with a high-purity silicon melt charged therein, thereby melting the raw material, and growing a silicon single crystal through a Czochralski method (referred to hereinafter as a "CZ method") or the like. A method to be implemented in the present disclosure may be applied to a CZ method in which a seed crystal is disposed on a silicon melt, thereby growing a single crystal.

The CZ method uses a high-purity crucible made of quartz because it is necessary to manufacture a high-purity silicon single crystal ingot with a high yield, and a long time is required to raise the silicon single crystal ingot when the silicon single crystal ingot has a large diameter.

However, a conventional silicon single crystal ingot growth apparatus has the following problems.

In order to obtain a silicon melt (Si melt), polysilicon (poly Si) is supplied to a crucible, and the crucible is then heated to melt the polysilicon. In this case, an inert gas, for example, argon (Ar), is supplied to an interior of a chamber, but argon atoms may be attached to a surface of the polysilicon and, as such, may be contained in the silicon melt, together with the melted polysilicon.

The argon atoms contained in the silicon melt as mentioned above may be included in a silicon single crystal ingot grown from the silicon melt and, as such, may form voids. In addition, in a wafer manufactured through the above-mentioned processes, the voids may form pin holes, thereby resulting in failure of the wafer.

DISCLOSURE

Technical Problem

Embodiments provide a method and an apparatus for growing a silicon single crystal ingot, which are capable of preventing formation of pin holes in a wafer manufactured therethrough.

Technical Solution

The object of the present disclosure can be achieved by providing a method of growing a silicon single crystal ingot, comprising the steps of (a) charging polysilicon in a crucible within a chamber, (b) melting the polysilicon in the crucible, thereby forming a silicon melt, (c) measuring a melting degree of the polysilicon, and (d) increasing a supply amount of an inert gas supplied to the chamber while decreasing an internal pressure of the chamber, after a predetermined portion of the polysilicon has been melted.

The method may further include the step of (e) additionally charging polysilicon in the crucible after the melting the polysilicon is completed. An internal pressure of the chamber in the step (e) may be adjusted to be equal to the internal pressure of the chamber in the step (d).

The supply amount of the inert gas supplied to the chamber may be decreased in the step (e).

The method may further include the step of (f) increasing the supply amount of the inert gas supplied to the chamber after a predetermined portion of the polysilicon charged in the step (e) is melted An internal pressure of the chamber in the step (f) may be adjusted to be equal to the internal pressure of the chamber in the step (e).

Measurement of the melting degree of the polysilicon may be determined based on a ratio between a low-temperature part and a high-temperature part of a surface of the silicon melt in the crucible obtained through measurement of the surface of the silicon melt.

A temperature of the low-temperature part may be 800 to 900° C., and a temperature of the high-temperature part may be 1,000° C. or more.

The internal pressure of the chamber may be adjusted through an exhaust unit disposed under the chamber.

The method may further include the step of (g) rotating the crucible in a predetermined direction or opposite directions after the step (f).

An amount of the inert gas supplied to the chamber and an internal pressure of the chamber in the step (g) may be adjusted to be equal to the amount of the inert gas supplied to the chamber and an internal pressure of the chamber in the step (f).

A rotation speed of the crucible may be 5 rpm or more, and a rotation time of the crucible may be 1 hour or more.

In another aspect of the present disclosure, provided herein is an apparatus for growing a silicon single crystal ingot, including a chamber, a crucible provided in an interior of the chamber and configured to receive a silicon melt, a heater provided in the interior of the chamber and disposed around the crucible, a heat shield provided at an upper portion of the crucible, an inert gas supplier configured to supply an inert gas to an inner region of the chamber, a temperature measurer configured to measure a surface temperature of the silicon melt, an exhaust unit configured to adjust an internal pressure of the chamber, a crucible rotator configured to support and rotate the crucible, and a controller configured to control operations of the exhaust unit, the inert gas supplier, the temperature measurer, and the crucible rotator.

The controller may control the inert gas supplier and the exhaust unit after a predetermined portion of polysilicon initially charged in the crucible is melted, to increase a supply amount of the inert gas supplied to the chamber and to decrease the internal pressure of the chamber.

Polysilicon may be additionally charged in the crucible after melting of the polysilicon initially charged in the crucible is completed, and the controller may control the inert gas supplier and the exhaust unit when the additional polysilicon charging is performed, to maintain the internal pressure of the chamber to be constant and to decrease a supply amount of the inert gas.

The controller may control the crucible rotator after melting of the polysilicon additionally charged in the crucible is completed, to rotate the crucible in a predetermined direction or opposite directions at a predetermined speed.

Advantageous Effects

In the silicon single crystal ingot growth method and apparatus according to the embodiments, it may be possible to reduce a failure rate caused by generation of pin holes in a manufactured wafer, by adjusting an internal pressure of the chamber and a supply amount of argon in steps of charging and melting polysilicon.

BEST MODE

Hereinafter, in order to describe in detail the present disclosure, the present disclosure will be described in conjunction with embodiments. For better understanding thereof, the present disclosure will be described in detail with reference to the accompanying drawings.

However, embodiments of the present disclosure may be embodied in many different forms and should not be construed as limited to the embodiments set forth herein. Rather, these embodiments are provided so that this disclosure will be thorough and complete, and will fully convey the scope of the disclosure to those having ordinary knowledge in the art.

In addition, it will be understood that relative terms used hereinafter such as “first”, “second”, “on” and “under” may be construed only to distinguish one element from another element without necessarily requiring or involving a certain physical or logical relation or sequence between the elements.

Figure 1:
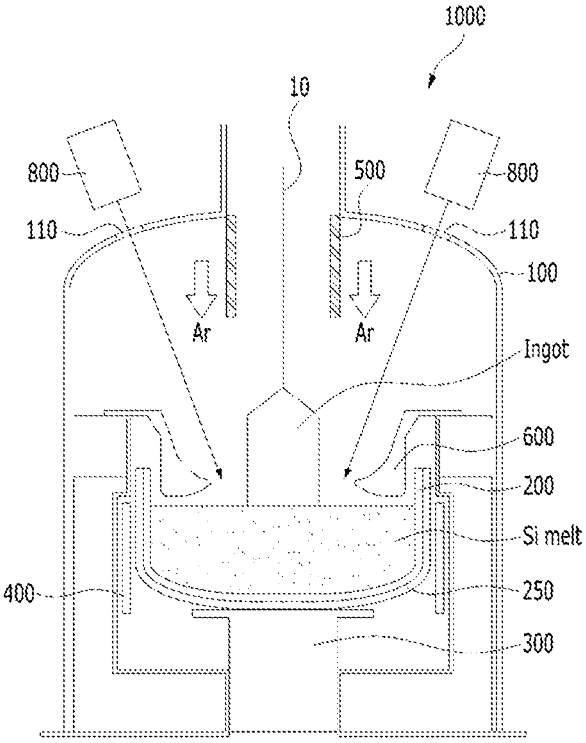
FIG. 1 is a view showing a silicon single crystal ingot growth apparatus according to an embodiment of the present disclosure.

FIG. 1 is a view showing a silicon single crystal ingot growth apparatus according to an embodiment of the present disclosure. Hereinafter, the silicon single crystal ingot growth apparatus according to the embodiment of the present disclosure will be described with reference to FIG. 1.

A silicon single crystal ingot growth apparatus 1000 according to an embodiment of the present disclosure may include a chamber 100 formed therein with a space in which a silicon single crystal ingot is grown from a silicon melt (Si melt), a crucible 200-250 configured to receive the silicon melt, a heater 400 configured to heat the crucible 200-250, a crucible rotator 300 configured to rotate and raise the crucible 200-250, a heat shield 600 disposed at an upper portion of the crucible 200-250 in order to block heat of the heater 400 toward the silicon single crystal ingot, a coolant tube 500 provided at an upper portion of the chamber 100 in an interior of the chamber 100 and configured to cool the rising hot silicon single crystal ingot, an inert gas supplier (not shown) configured to supply an inert gas to an inner region of the chamber 100, and a temperature measurer 800 configured to measure a surface temperature of the silicon melt.

The chamber 100 provides a space in which predetermined processes for formation of a silicon single crystal ingot from a silicon melt (Si melt) are performed.

The crucible 200-250 may be provided in the interior of the chamber 100 in order to receive a silicon melt (Si melt). The crucible 200-250 may be constituted by a first crucible 200 directly contacting the silicon melt, and a second crucible 250 supporting the first crucible 200 while surrounding an outer surface of the first crucible 200. The first crucible 200 may be made of quartz, and the second crucible 250 may be made of graphite.

The second crucible 250 may be divided into two or three parts, to cope with expansion of the first crucible 200 by heat. For example, when the second crucible 250 is divided into two parts, a gap is formed between the two parts and, as such, the second crucible 250 may not be damaged even when the first crucible 200 inside the second crucible 250 expands.

An insulator may be provided within the chamber 100 in order to prevent discharge of heat of the heater 400. Although only the heat shield 600 at an upper portion of the crucible 200-250 is shown in this embodiment, insulators may also be disposed at a side surface of the crucible 200-250 and under the crucible 200-250, respectively.

The heater 400 may melt a polycrystalline silicon supplied to an interior of the crucible 200-250, thereby producing a silicon melt (Si melt). The heater 400 may receive current from a current supply rod (not shown) disposed over the heater 400.

A magnetic field generator (not shown) may be provided outside the chamber 100, to apply a horizontal magnetic field to the crucible 200-250.

The crucible rotator 300 may be disposed at a central portion of a bottom surface of the crucible 200-250, to support and rotate the crucible 200-250. As a seed (not shown) hanging down from a seed chuck 10 disposed over the crucible 200-250 is immersed in a silicon melt, and the silicon melt is then solidified, a silicon single crystal ingot may be grown from the seed.

During a process of growing a silicon single crystal ingot, an inert gas, for example, argon (Ar), may be supplied to the interior of the chamber 100. In this embodiment, argon may be supplied from the inert gas supplier (not shown).

The inert gas supplier may be provided outside the chamber 100, and may supply argon to the interior of the chamber 100 through an opening provided in an upper region of the chamber 100. Argon supplied from the inert gas supplier may exhaust oxygen remaining in the interior of the chamber 100 after evaporating from the silicon melt (Si melt), but may also penetrate the silicon melt in a state of being attached to a surface of polysilicon. In order to prevent argon from penetrating the silicon melt, the silicon single crystal ingot growth apparatus and method may be provided with the following configuration.

The temperature measurer 800 may be, for example, a pyrometer. In this case, the temperature measurer 800 may be provided in a pair over the chamber 100, without being limited thereto. For example, when a pair of temperature measurers 800 is provided, the pair of temperature measurers 800 may be disposed at positions symmetrical with reference to a center of the chamber 100, respectively. The temperature measurer 800 may measure a surface temperature of the silicon melt.

A transparent region 110 is provided in the upper region of the chamber 100. For example, a transparent member may be disposed in the transparent region 110, and respective temperature measurers 800 may measure a surface temperature of the silicon melt (Si melt) through a pair of transparent regions 110.

Figure 2:
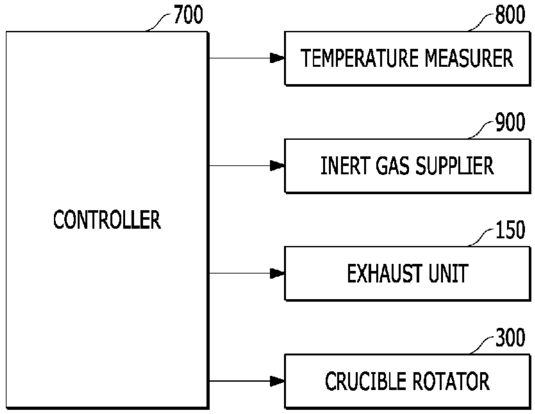
FIG. 2 is a view showing operation of each configuration in the apparatus of FIG. 1.

FIG. 2 is a view showing operation of each configuration in the apparatus of FIG. 1.

The silicon single crystal ingot growth apparatus 1000 according to this embodiment may further include an exhaust unit 150 and an inert gas supplier 900, in addition to the crucible rotator 300 and the temperature measurer 800 shown in FIG. 1. Operations of the exhaust unit 150, the crucible rotator 300, the temperature measurer 800, and the inert gas supplier 900 may be controlled by a controller 700.

Figure 3:
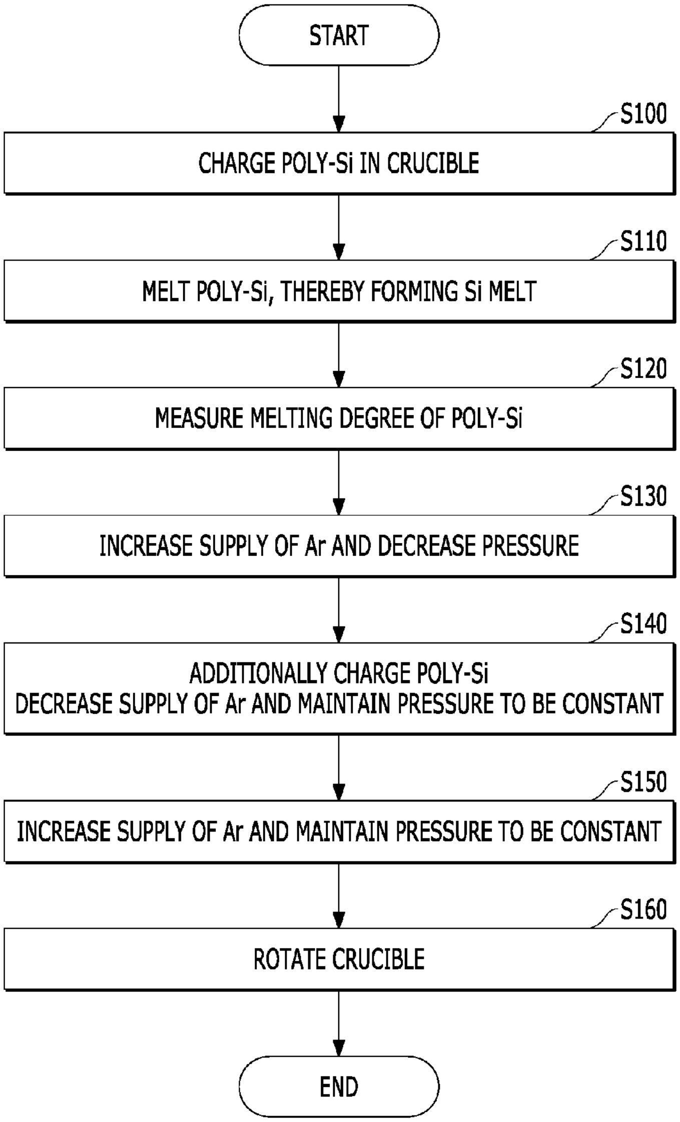
FIG. 3 is a view showing a silicon single crystal ingot growth method according to an embodiment of the present disclosure.

FIG. 3 is a view showing a silicon single crystal ingot growth method according to an embodiment of the present disclosure. Hereinafter, a method of growing a silicon single crystal ingot using the silicon single crystal ingot growth apparatus of FIGS. 1 and 2 will be described with reference to FIG. 3.

First, polysilicon (poly Si) is charged in a crucible inside a chamber (S100).

Figure 4:
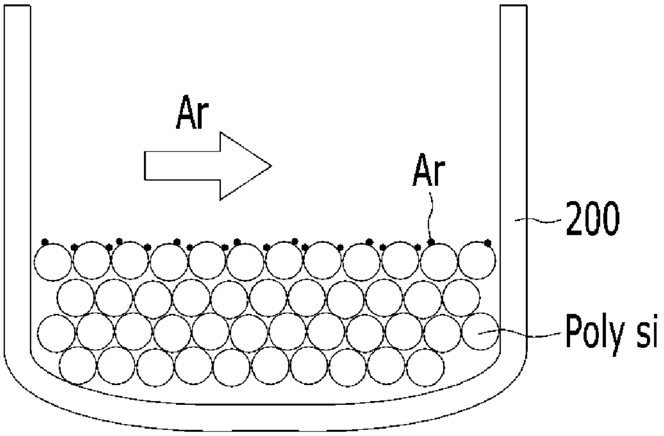
FIGS. 4 to 7 are views showing supply and melting of polysilicon in the method of FIG. 3.

In this case, as inert gas, argon may be supplied to the chamber. Accordingly, argon atoms may be adsorbed on a surface of the polysilicon in a crucible 200, as shown in FIG. 4.

Figure 5:
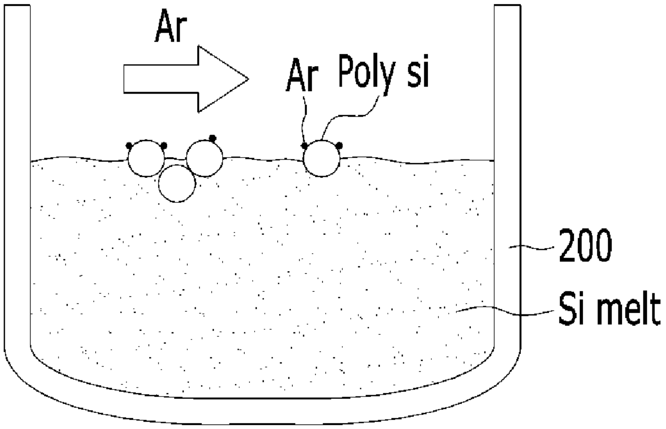

Then, a temperature of the crucible may be raised through a heating member or the like and, as such, the polysilicon in the crucible may be melted, thereby producing a silicon melt (S110). In this case, the polysilicon may form a silicon melt (Si melt) in accordance with melting thereof, and a part of the polysilicon, which has not been melted yet, may float on a surface of the silicon melt, as shown in FIG. 5. In this case, a part of argon elements may be in a state of still being adsorbed on the surface of the non-melted polysilicon.

A melting degree of the polysilicon may then be measured (S120). In this case, measurement of the melting degree of the polysilicon may be achieved by determining a ratio between a low-temperature part and a high-temperature part of the surface of the silicon melt through the above-described temperature measurer or the like. Since the temperature of polysilicon in a solid state is greatly lower than the temperature of a silicon melt in a liquid state, it may be possible to measure a temperature distribution profile in which polysilicon of a low temperature floats on the silicon melt of a high temperature, through measurement of a surface temperature of the silicon melt in the crucible by the temperature measurer or the like.

For example, the temperature of the low-temperature part, that is, the low-temperature polysilicon, may be 800 to 900° C., and the temperature of the high-temperature part, that is, the silicon melt, may be 1,000° C. or more.

When a predetermined portion of the polysilicon is measured as having been melted, a supply amount of argon gas supplied to the chamber may be increased, and an internal pressure of the chamber may be decreased (S130).

The case in which a predetermined portion of the polysilicon is measured as having been melted means that the surface area of the low-temperature polysilicon at the surface of the silicon melt in the crucible 200 is equal to or less than a predetermined value. Practically, it is difficult to measure the weight of a melted portion of the polysilicon. To this end, whether or not the surface area of the low-temperature polysilicon at the surface of the silicon melt in the crucible 200 is equal to or less than the predetermined value is determined through measurement of the internal temperature of the crucible 200 by the temperature measurer. When the surface area of the low-temperature polysilicon at the surface of the silicon melt in the crucible 200 is equal to or less than the predetermined value, it may be estimated that the predetermined portion of the polysilicon has been melted. For example, when the surface area of the low-temperature polysilicon at the surface of the silicon melt in the crucible 200 is equal to or less than 10%, it may be determined that given conditions have been established.

When argon gas is supplied in a state in which a large amount of polysilicon remains in the crucible 200, argon atoms may be adsorbed on the surface of the polysilicon. In this case, accordingly, an increase in the supply amount of argon gas may not be carried out. On the other hand, when it is determined that the predetermined portion of the polysilicon has been melted, the supply amount of argon gas may be increased because the possibility that argon is adsorbed or captured on the surface of the polysilicon is reduced.

Figure 6:
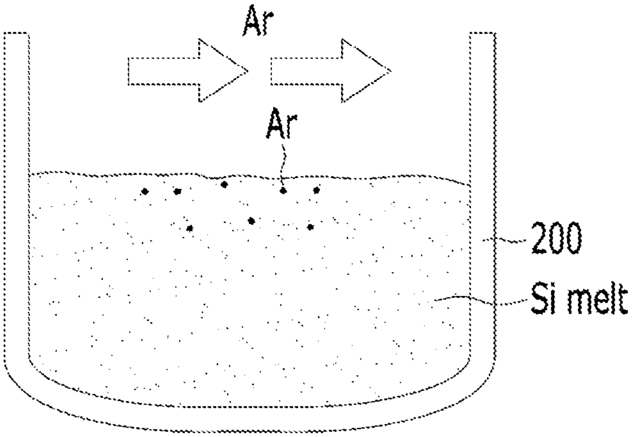

In this case, as shown in FIG. 6, it may be possible to outwardly exhaust the argon gas from the surface of the silicon melt or a region adjacent thereto by increasing the supply amount or the supply velocity of the argon gas. In addition, it may be possible to effectively discharge argon atoms and other atoms at the surface of the silicon melt by decreasing the internal pressure of the chamber. Here, the other atoms may be carbon or oxygen. For example, in the case of carbon, the carbon may be introduced from various parts in the chamber 100 into the silicon melt. In the case of oxygen, the oxygen may be introduced from quartz in the crucible 200 into the silicon melt. Carbon or oxygen introduced into the silicon melt may penetrate the silicon single crystal ingot in accordance with rotation of the crucible 200 and the seed. To this end, carbon or oxygen may be outwardly discharged through an increase in the supply amount of argon gas and a reduction in the internal pressure of the chamber as described above.

Adjustment in the supply amount of argon and the internal pressure of the chamber may be achieved by controlling operations of the inert gas supplier 900 and the exhaust unit 150 through the controller 700 of FIG. 2.

Typically, it is necessary to charge polysilicon into a crucible two times or more for preparation of a silicon melt required for one-time production of a silicon single crystal ingot, taking into consideration sizes of a chamber and the crucible. This is because the size of a polysilicon supply device may be insufficient to charge a very large amount of polysilicon at once.

Figure 7:
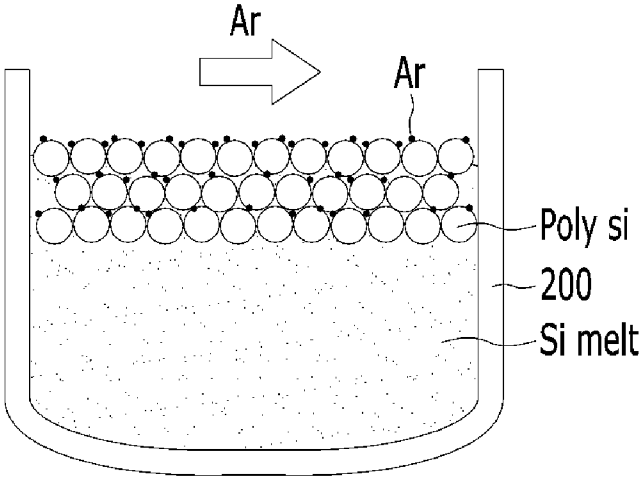

After argon atoms, etc. are outwardly discharged from the surface of the silicon melt in the crucible in accordance with continuation of step S130, as described above, for a predetermined time or after melting of the polysilicon is completed, polysilicon may be additionally charged from the above-described polysilicon supply device in the silicon melt in the crucible (S140). That is, as shown in FIG. 7, polysilicon (poly Si) may be additionally supplied to the silicon melt (Si melt) in the crucible 200.

In this case, the internal pressure of the chamber may be adjusted to be equal to that of step S130, and the supply amount of inert gas, that is, argon, may be decreased. In addition, the decreased supply amount of argon may be equal to the supply amount of argon in step S120.

In addition, a melting degree of the polysilicon may be measured, similarly to step S120. When a predetermined portion of the polysilicon is measured as having been melted, a supply amount of argon gas supplied to the chamber may be increased, and an internal pressure of the chamber may be maintained constant (S150).

That is, the supply amount of argon gas may be decreased in order to discharge argon atoms adsorbed on the surface of the silicon melt and the polysilicon in step S140.

The reason why the supply amount of argon is increased in steps S130 and S150 is to outwardly discharge argon atoms because, when most of the polysilicon is melted, the internal temperature of the chamber and the temperature of the silicon melt increase, thereby causing activity of argon atoms to be increased, and, as such, the possibility that the argon atoms are captured on the surface of the silicon melt may be increased. In addition, when the polysilicon remains in a large amount without being melted, argon gas may strike polysilicon lumps and, as such, a capture possibility thereof may be increased. For this reason, argon gas is not supplied, or the supply amount thereof is decreased.

In addition, the reason why the internal pressure of the chamber is maintained constant after step S130 is to smoothly exhaust argon gas because a sufficient amount of argon gas is already present in the chamber.

In addition, when charging and melting of polysilicon performed two times or more, as described above, are completed, stabilization may then be performed. For example, it may be possible to stabilize the silicon melt in the crucible by rotating the crucible (S160). In this case, a temperature or a convection state in the silicon melt may be stabilized.

In addition, the amount of inert gas supplied to the chamber and the internal pressure of the chamber in step S160 may be equal to the amount of inert gas supplied to the chamber and the internal pressure of the chamber in step S150, respectively. In detail, the rotation speed of the crucible may be 5 rpm or more, the rotation time of the crucible may be 1 hour or more, and the rotation direction of the crucible may be a predetermined direction or opposite directions.

Figure 8A:
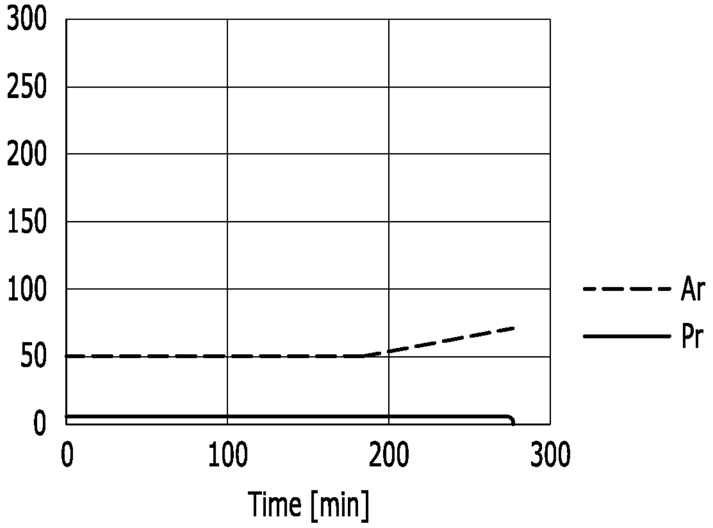
FIGS. 8A to 8C are views showing a supply amount of argon and an internal pressure of a chamber in the silicon single crystal ingot growth method according to the embodiment of the present disclosure.
Figure 8B:
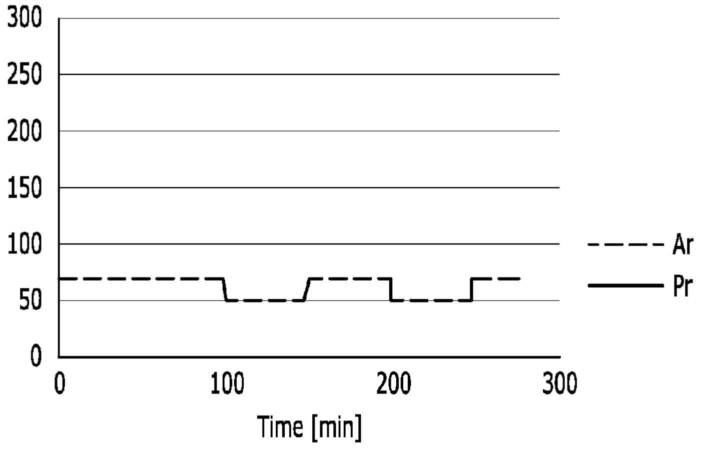
Figure 8C:
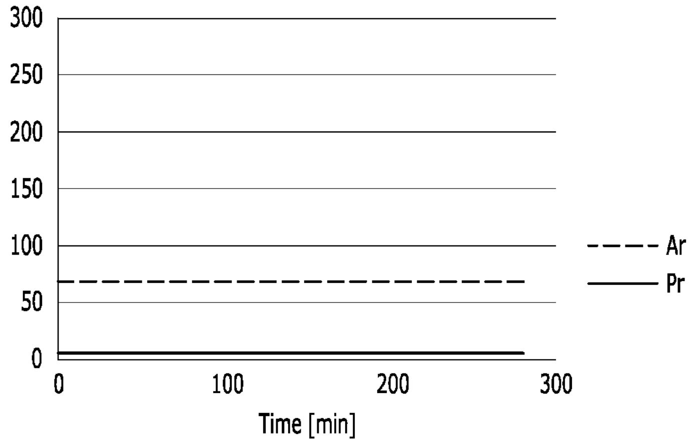
Figure 9A:
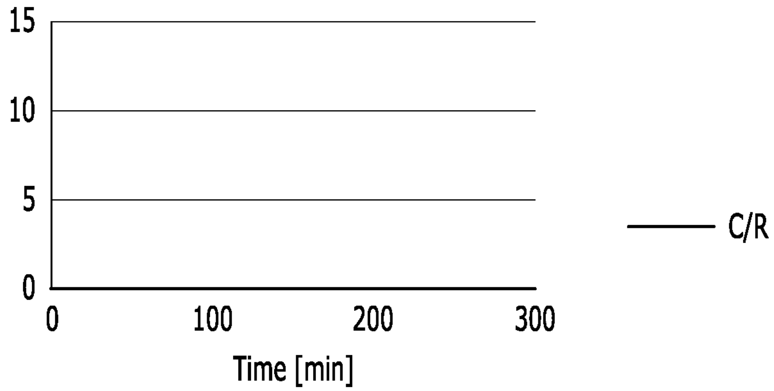
FIGS. 9A to 9C are views showing rotation of the crucible in the silicon single crystal ingot growth method according to the embodiment of the present disclosure.
Figure 9B:
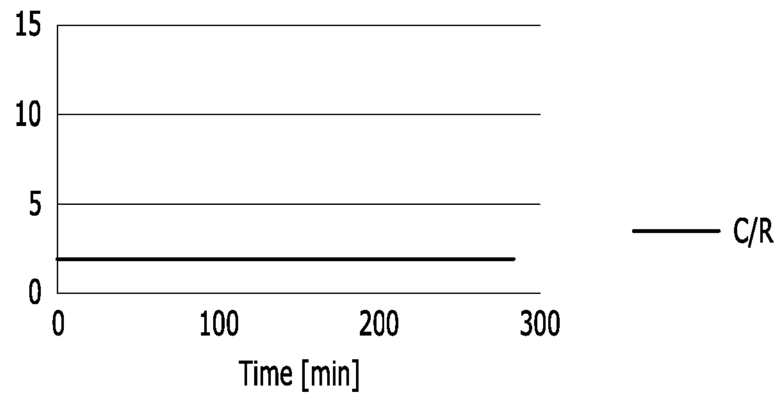
Figure 9C:
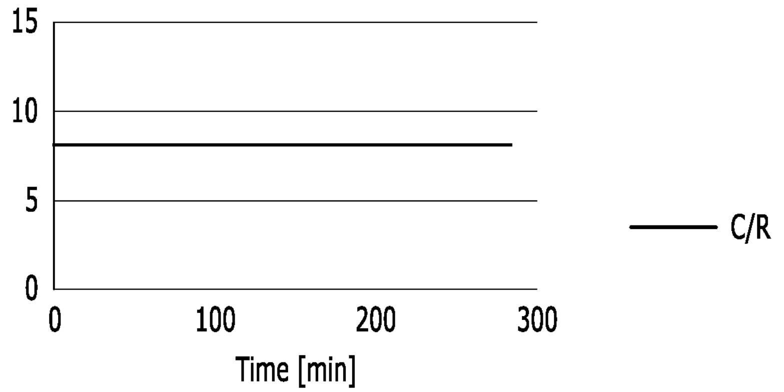

FIGS. 8A to 8C are views showing a supply amount of argon and an internal pressure of a chamber in the silicon single crystal ingot growth method according to the embodiment of the present disclosure. FIGS. 9A to 9C are views showing rotation of the crucible in the silicon single crystal ingot growth method according to the embodiment of the present disclosure.

FIGS. 8A and 9A show steps of primary supply and melting of polysilicon, FIGS. 8B and 9B show steps of secondary and third supply and melting of polysilicon, and FIGS. 8C and 9C show stabilization processes. In each graph, values on a horizontal axis and a vertical axis may be optional and, as such, increase and decrease relations thereof should be noted.

Referring to FIGS. 8A and 9A, in the steps of primary supply and melting of polysilicon, the crucible does not rotate, the internal pressure of the chamber is decreased after a predetermined time elapses, and the supply amount of argon is increased after the predetermined time elapses. This time may be the time when it is measured that most of the primarily supplied polysilicon has been melted.

In FIGS. 8B and 9B, the supply amount of argon supplied to the chamber is repeatedly increased and decreased. During additional supply of polysilicon carried out after completion of melting of most of the polysilicon, the supply amount of argon gas is again decreased. In addition, after completion of melting of most of the additionally supplied polysilicon, the supply amount of argon may be again increased. It may be seen that, after initial charging of polysilicon in FIG. 8A, polysilicon is additionally supplied two times in FIG. 8B. In addition, it may be seen that the internal pressure of the chamber in FIG. 8B is increased after completion of melting of the initially charged polysilicon and, as such, is maintained constant in FIG. 8B.

In addition, in FIG. 9B, it may be seen that the crucible rotates slowly in the steps of additional supply and melting of polysilicon. However, the present disclosure is not limited to the above-described condition, and the crucible may not rotate.

In FIG. 8C, after completion of the steps of initial and additional charging and melting of polysilicon, the supply amount of argon gas may be equal to the supply amount of argon gas increased in a later part of FIG. 8A, and may be maintained constant. In addition, in FIG. 8C, the internal pressure of the chamber may be maintained constant.

In addition, it may be seen that, in the stabilization step of FIG. 9C, the crucible rotates in a predetermined direction at a predetermined speed.

Figure 10:
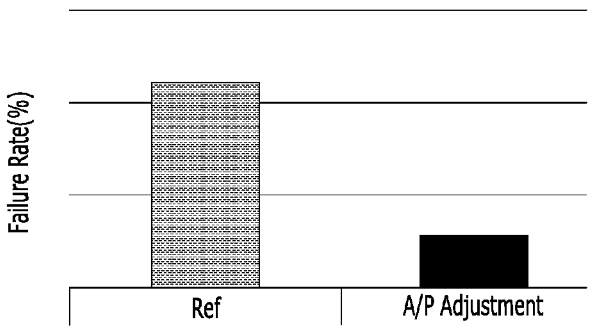
FIGS. 10 and 11 are view showing effects of the silicon single crystal ingot growth method and apparatus according to the embodiments of the present disclosure.
Figure 11:
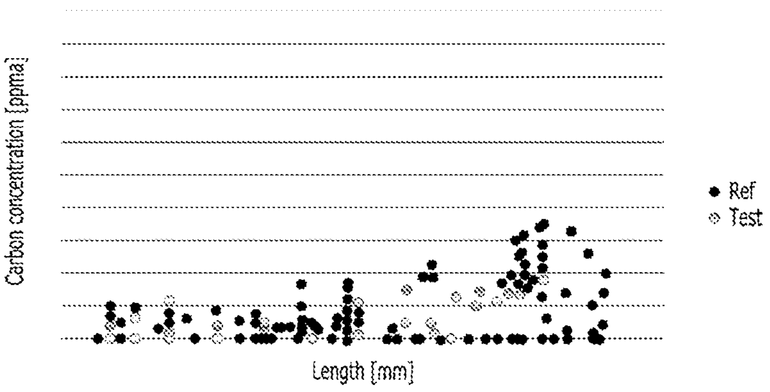

FIGS. 10 and 11 are view showing effects of the silicon single crystal ingot growth method and apparatus according to the embodiments of the present disclosure.

In FIG. 10, a horizontal axis represents a comparative example (reference) and an example, and a vertical axis represents a failure rate. As shown in FIG. 10, it may be seen that a failure rate, that is, a pin hole generation degree, of a manufactured wafer when a pressure P and an argon supply amount A are adjusted in accordance with the example is remarkably reduced, as compared to the case in which a pressure and an argon supply amount are adjusted in accordance with the comparative example.

In FIG. 11, a horizontal axis represents an axial length of an ingot, and a vertical axis represents concentrations (ppma) of carbon (C) at different portions of the ingot. As shown in FIG. 11, it may be seen that concentrations of carbon, fine particles, and metals are remarkably decreased at each portion of the ingot, in particular, a latter part of the axial length of the ingot in the example, as compared to those in the comparative example. Such effects are obtained because discharge of argon elements and other elements from a silicon melt was possible through control of supply amount of argon and internal pressure of the chamber in the above-described silicon single crystal ingot growth method and apparatus.

Although the foregoing embodiments have been described mainly in conjunction with limitative embodiments and drawings, the present disclosure is not limited to the above-described embodiments. Those skilled in the art to which the present disclosure pertains may appreciate that various modifications and alterations may be possible based on the foregoing description.

Therefore, the scope of the present disclosure should not be interpreted as being limited by the described embodiments, and should be defined by the appended claims and their equivalents.

INDUSTRIAL APPLICABILITY

The apparatus and method according to the embodiments are applicable to growth of a silicon single crystal ingot.

The invention claimed is:

1. A method of growing a silicon single crystal ingot, comprising:

charging polysilicon in a crucible within a chamber; melting the polysilicon in the crucible, thereby forming a silicon melt;

measuring temperatures at different portions of a surface of the silicon melt and determining whether a predetermined portion of the polysilicon has been melted; and increasing a supply amount of an inert gas supplied to the chamber while decreasing an internal pressure of the chamber, when the predetermined portion of the polysilicon has been melted, wherein measurement of a melting degree of the polysilicon is determined based on a ratio between a low-temperature part and a high-temperature part of the surface of the silicon melt in the crucible obtained through measurement of the surface of the silicon melt, wherein a temperature of the low-temperature part is 800 to 900° C., and a temperature of the high-temperature part is 1,000° C. or more, and wherein the internal pressure of the chamber is adjusted through an exhauster disposed under the chamber.

2. The method according to claim 1, further comprising:

additionally charging polysilicon in the crucible after the melting the polysilicon is completed, wherein the internal pressure of the chamber in additionally charging the polysilicon in the crucible is adjusted to be equal to the internal pressure of the chamber in increasing the supply amount of the inert gas.

3. The method according to claim 2, wherein the supply amount of the inert gas supplied to the chamber is decreased in additionally charging the polysilicon in the crucible.

4. The method according to claim 2, further comprising:

again increasing the supply amount of the inert gas supplied to the chamber after a predetermined portion of the polysilicon charged in additionally charging the polysilicon in the crucible is melted.

5. The method according to claim 4, wherein the internal pressure of the chamber in again increasing the supply amount of the inert gas is adjusted to be equal to the internal pressure of the chamber in additionally charging the polysilicon in the crucible.

6. The method according to claim 4, further comprising:

rotating the crucible in a predetermined direction or opposite directions after again increasing the supply amount of the inert gas.

7. The method according to claim 6, wherein an amount of the inert gas supplied to the chamber and the internal pressure of the chamber in rotating the crucible are adjusted to be equal to the amount of the inert gas supplied to the chamber and the internal pressure of the chamber in again increasing the supply amount of the inert gas.

8. The method according to claim 6, wherein a rotation speed of the crucible is 5 rpm or more, and a rotation time of the crucible is 1 hour or more.

* * * * *